(12) United States Patent
Fraser et al.

(10) Patent No.: US 10,283,500 B2
(45) Date of Patent: May 7, 2019

(54) METHODS OF FABRICATING INTEGRATED CIRCUITS AND DEVICES WITH INTERLEAVED TRANSISTOR ELEMENTS

(71) Applicant: NXP USA, Inc., Austin, TX (US)

(72) Inventors: Michael L. Fraser, Tempe, AZ (US); Frank E. Danaher, Gilbert, AZ (US); Jason R. Fender, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/720,076

(22) Filed: Sep. 29, 2017

(65) Prior Publication Data

US 2018/0033787 A1 Feb. 1, 2018

Related U.S. Application Data

(62) Division of application No. 14/887,061, filed on Oct. 19, 2015, now Pat. No. 9,780,090.

(51) Int. Cl.
*H01L 27/085* (2006.01)
*H01L 21/82* (2006.01)
*H03K 17/687* (2006.01)
*H01L 27/02* (2006.01)
*H01P 1/15* (2006.01)

(52) U.S. Cl.
CPC .......... *H01L 27/085* (2013.01); *H01L 21/82* (2013.01); *H01L 27/0207* (2013.01); *H01L 27/0211* (2013.01); *H01P 1/15* (2013.01); *H03K 17/6871* (2013.01)

(58) Field of Classification Search
CPC ... H01L 21/82; H01L 27/085; H01L 27/0207; H01L 27/0211
See application file for complete search history.

(56) References Cited

U.S. PATENT DOCUMENTS

| | | | |
|---|---|---|---|
| 6,522,203 B1* | 2/2003 | Tiren | H01L 27/088 257/E27.06 |
| 2012/0112832 A1* | 5/2012 | Kawano | H03F 3/72 330/124 D |
| 2014/0011463 A1* | 1/2014 | Madan | H04B 1/44 455/78 |
| 2015/0289360 A1* | 10/2015 | Leong | H01L 23/5221 361/782 |

(Continued)

*Primary Examiner* — Fazli Erdem
(74) *Attorney, Agent, or Firm* — Sherry W. Schumm

(57) ABSTRACT

A monolithic integrated circuit includes first and second pluralities of parallel-connected transistor elements (e.g., transistor fingers). To spread heat in the IC, the first and second pluralities of transistor elements are interleaved with each other and arranged in a first row. The IC also may include third and fourth pluralities of parallel-connected transistor elements arranged in a second row. The transistor elements in the first row may be series and shunt transistors of an RF switch transmit path, and the transistor elements in the second row may be series and shunt transistors of an RF switch receive path. During a transmit mode of operation, the series transistors in the transmit path and the shunt transistors in the receive path are closed. During a receive mode of operation, the shunt transistors in the transmit path and the series transistors in the receive path are closed.

20 Claims, 7 Drawing Sheets

(56) References Cited

U.S. PATENT DOCUMENTS

2016/0056978 A1* 2/2016 Zhu .................... H04L 25/0266
 455/83
2016/0065206 A1* 3/2016 Ho ....................... H03K 17/687
 455/83

* cited by examiner

US 10,283,500 B2

METHODS OF FABRICATING INTEGRATED CIRCUITS AND DEVICES WITH INTERLEAVED TRANSISTOR ELEMENTS

RELATED APPLICATION

This application is a divisional of co-pending, U.S. patent application Ser. No. 14/887,061, filed on Oct. 19, 2015.

TECHNICAL FIELD

Embodiments of the subject matter described herein relate generally to semiconductor devices that include multiple transistor elements (e.g., transistor fingers) and methods for fabricating such devices.

BACKGROUND

Microwave field effect transistors are used extensively in various types of radio frequency (RF) circuits, such as power amplifiers, RF switches, and other circuits. Various types of high-power microwave field effect transistors currently are produced, including aluminum gallium nitride/gallium nitride heterojunction field effect transistors (AlGaN/GaN HFET's), gallium arsenide pseudomorphic high electron mobility transistors (GaAs pHEMT's), gallium arsenide metal-semiconductor field effect transistors (GaAs MESFET's), and silicon laterally diffused metal-oxide semiconductor (Si-LDMOS) transistors.

A microwave field effect transistor used in an RF circuit may generate significant heat when non-zero voltage and current simultaneously appear at a semiconductor junction under operation. With an ever-present trend to increase the power handling capability of microwave field effect transistors, the junction temperatures of conventionally-designed transistors also continue to increase. In some cases, under high-power operation, junction temperatures may exceed the temperature rating of the device channel and present device reliability problems. It is clear that the temperature of the semiconductor junction under operation is a factor limiting the amount of RF power that can reliably pass through a transistor. Therefore, structures and methods that reduce operational junction temperatures are desired.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Embodiments of the inventive subject matter include microwave transistors in which relatively high-power dissipating transistor elements and relatively low-power dissipating transistor elements are interleaved in an alternating manner within a monolithic integrated circuit (IC). By interleaving transistor elements in this manner, power dissipation within the device may be more effectively distributed, when compared with conventional devices in which such transistor elements are not interleaved. By effectively distributing the high-power and low-power dissipating transistor elements, according to the various embodiments, the peak junction temperatures within an IC may be reduced significantly, thus potentially increasing device reliability. In other words, the heat produced by the transistor elements is more evenly spread across the device. Further, embodiments of the below-described microwave transistors may be implemented without significantly increasing die area or detrimentally affecting device performance.

Figure 1:
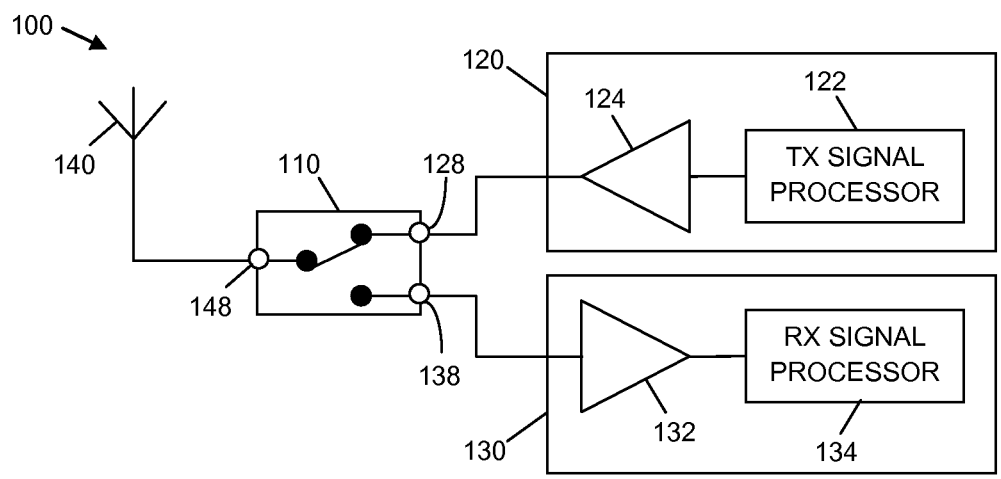
FIG. 1 is a simplified block diagram of a radio frequency (RF) transceiver system.
Figure 2:
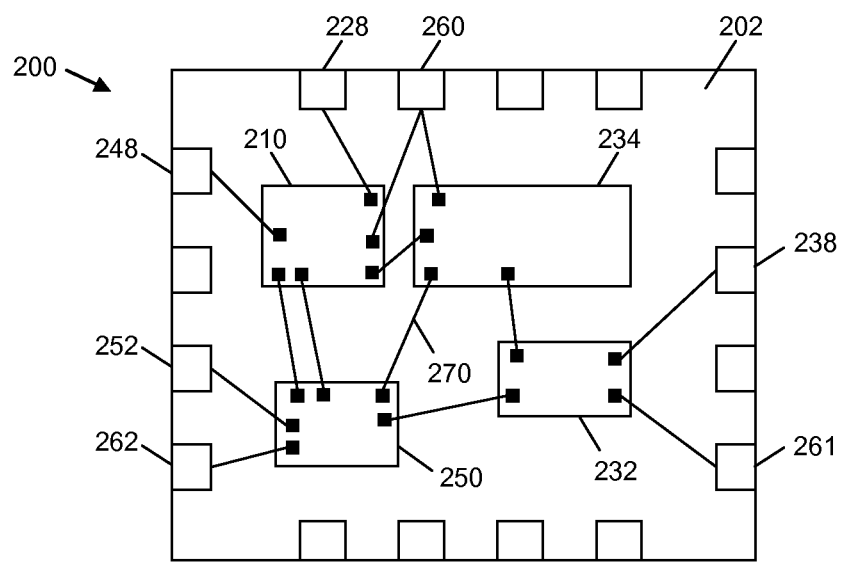
FIG. 2 is a top view of a module that embodies a portion of the RF transceiver system of FIG. 1, in accordance with an embodiment.
Figure 3:
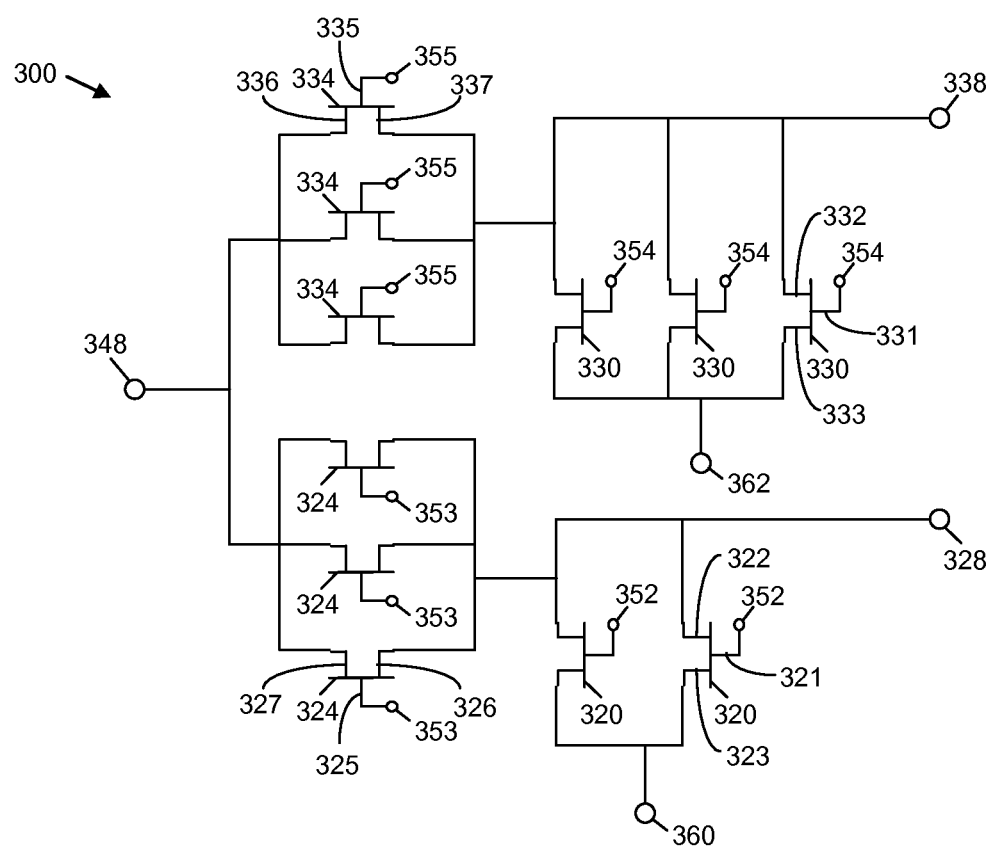
FIG. 3 is a simplified circuit diagram of an RF switch, in accordance with an embodiment.

Before describing microwave transistor IC embodiments in detail, examples of a system, a module, and a circuit in which such a transistor IC embodiment may be implemented are described in conjunction with FIGS. 1-3, respectively. It is to be understood that the later-described transistor IC embodiments may be implemented in a wide variety of other systems, modules, and circuits. Therefore, the example system, module, and circuit of FIGS. 1-3 are not to be construed as limiting the scope of the inventive subject matter.

FIG. 1 is a simplified block diagram of an example of a radio frequency (RF) transceiver system 100 that includes an RF switch 110, a transmitter 120, a receiver 130, and an antenna 140. Transceiver system 100 is a half-duplex transceiver, in which only one of the transmitter 120 or the receiver 130 are coupled, through the RF switch 110, to the antenna 140 at any given time. More specifically, the state of the RF switch 110 is controlled (e.g., by RF switch controller 250, FIG. 2) to alternate between coupling an RF transmit signal produced by the transmitter 120 to the antenna 140, or coupling an RF receive signal received by the antenna 140 to the receiver 130.

The transmitter 120 may include, for example, a transmit (TX) signal processor 122 and a power amplifier 124. The transmit signal processor 122 is configured to produce transmit signals, and to provide the transmit signals to the power amplifier 124. The power amplifier 124 amplifies the transmit signals, and provides the amplified transmit signals to the RF switch 110. The receiver 130 may include, for example, a receive amplifier 132 (e.g., a low noise amplifier) and a receive (RX) signal processor 134. The receive amplifier 132 is configured to amplify relatively low power received signals from the RF switch 110, and to provide the amplified received signals to the receive signal processor 134. The receive signal processor 134 is configured to consume or process the receive signals.

During each transmit time interval, the RF switch 110 is controlled to be in a first or "transmit" state, as depicted in FIG. 1, in which a transmit signal path is closed between transmitter node 128 and antenna node 148, and in which a receive signal path is open between antenna node 148 and receiver node 138. Conversely, during each receive time interval, the RF switch 110 is controlled to be in a second or "receive" state, in which the receive signal path is closed between antenna node 148 and receiver node 138, and in which the transmit signal path is open between transmitter node 128 and antenna node 148.

The RF transceiver system 100 may be physically implemented using a variety of active and passive electrical devices, which may be housed on one or more printed circuit boards (PCBs) and/or other substrates. To facilitate assembly of such a system, various components of the RF transceiver system 100 may be implemented in self-contained modules or electrical devices, which may be coupled to a PCB that electrically connects the module/devices to other portions of the RF transceiver system 100. As used herein, the term "module" means a set of active and/or passive electrical devices (e.g., ICs and components) that are physically contained within a single housing (e.g., the device(s) are included on a common substrate (referred to herein as a "module substrate") or within a single package. A "module" also includes a plurality of conductive terminals for electrically connecting the set of devices to external circuitry that forms other portions of an electrical system. Essentially, the module substrate configuration, the method of coupling the device(s) to the module's terminals, and the number of devices within the module defines the module type. For example, in various embodiments, a module may be in the form of a surface mount device, a chip carrier device, a ball, pin, or land grid array device, a flat package (e.g., a quad or dual flat package) device, a chip scale packaged device, a system-in-package (SiP) device, or in the form of some other type of integrated circuit package. Although a particular type of module is described below, it is to be understood that embodiments of the inventive subject matter may be included in other types of modules, as well.

For example, FIG. 2 is a top view of a module 200 that embodies a portion of the RF transceiver system 100 of FIG. 1, in accordance with an embodiment. Module 200 includes a module substrate 202, which may be a relatively small PCB, a conductive flange, or another rigid structure. Module 200 also includes a plurality of ICs coupled to the module substrate 202, including an RF switch integrated circuit (IC) 210 (e.g., RF switch 110, FIG. 1), a receive amplifier IC 232 (e.g., receive amplifier 132, FIG. 1), a receive matching circuit IC 234, and an RF switch controller IC 250. In addition, module 200 includes a transmit signal input terminal 228 (e.g., corresponding to transmitter node 128, FIG. 1), a receive signal output terminal 238 (e.g., corresponding to receiver node 138, FIG. 1), an antenna terminal 248 (e.g., corresponding to antenna terminal 148, FIG. 1), a transmit/receive (TX/RX) control signal terminal 252, one or more ground terminals 260, 261, and one or more power terminals 262. The various ICs 210, 232, 234, 250 and terminals 228, 238, 248, 252, 260-262 are electrically connected together through a plurality of wirebonds 270. In other embodiments, various ones of the ICs 210, 232, 234, 250 and terminals 228, 238, 248, 252, 260-262 may be electrically connected together using other conductive structures (e.g., conductive traces on and within module substrate 202 and/or conductive vias through module substrate 202). In various embodiments, the module 200 may be housed in an air-cavity package or an overmolded (e.g., encapsulated) package, although the module 200 may be considered to be complete without such packaging, as well.

After incorporation of module 200 into a transceiver system (e.g., system 100, FIG. 1), and during operation of the transceiver system, power and ground reference voltages may be provided to module 200 through power and ground terminals 260-262. RF switch controller IC 250 may convert an input power voltage (e.g., +5.0 volts) received through power terminal 260. In addition, RF switch controller IC 250 may receive switch control signals (e.g., TTL level signals) through TX/RX control signal terminal 252. Based on the received switch control signals, the RF switch controller IC 250 provides switch control signals to control terminals (e.g., gates) of various transistors (e.g., transistors 320, 324, 330, 334, FIG. 3) of the RF switch IC 210. As will be described in more detail later, the switch control signals determine whether each of the various transistors is in a conducting or non-conducting state at any given time. More specifically, the switch control signals determine whether the RF switch IC 210 is in a transmit state or a receive state at any given time.

When the switch control signals place the RF switch IC 210 in the transmit state, transmit signals received by the RF switch IC 210 from a power amplifier (e.g., power amplifier 124, FIG. 1) through the transmit signal input terminal 228 are passed through the RF switch IC 210 to the antenna terminal 248. Conversely, when the switch control signals place the RF switch IC 210 in the receive state, signals received from the antenna terminal 248 are passed through the RF switch IC 210 to the receive matching circuit IC 234. The receive matching circuit IC 234 may include one or more integrated passive devices (e.g., capacitors, inductors, and/or resistors). The integrated passive devices, along with inductances of the wirebonds 270 between the receive matching circuit IC 234, the RF switch IC 210, and the receive amplifier IC 232, compose an impedance matching circuit between the RF switch IC 210 and the receive amplifier IC 232. In an alternate embodiment, the receive matching circuit IC 234 may be replaced by discrete components. Either way, the impedance matching circuit also may perform filtering of receive signals that pass from the RF switch IC 210 to the receive amplifier IC 232 through the impedance matching circuit. The receive amplifier IC 232 receives the receive signals from the receive matching circuit IC 234, and amplifies the receive signals. The receive amplifier IC 232 then provides the amplified receive signals to receive signal output terminal 238.

As will be described in detail below, embodiments of the inventive subject matter pertain to implementations of an RF switch IC (e.g., RF switch 110, 210, FIGS. 1, 2), which includes multiple microwave transistors in which relatively high-power dissipating transistor elements and relatively low-power dissipating transistor elements are interleaved in an alternating manner to more effectively distribute power dissipation within the IC. Before discussing the physical implementation of the RF switch IC, a schematic depiction of an embodiment of an RF switch IC is discussed in conjunction with FIG. 3.

More specifically, FIG. 3 is a simplified circuit diagram of an embodiment of an RF switch 300 (e.g., RF switch IC 210, FIG. 2) that may be used in the transceiver system 100 of FIG. 1, or in another system or circuit. RF switch 300 may be implemented as a monolithic IC (e.g., RF switch IC 210, 400, FIGS. 2, 4), which includes a transmit signal input node 328 (e.g., corresponding to transmitter node 128, FIG. 1), a receive signal output node 338 (e.g., corresponding to receiver node 138, FIG. 1), an antenna node 348 (e.g., corresponding to antenna terminal 148, FIG. 1), and multiple switch control signal nodes 352, 353, 354, 355. In addition, RF switch 300 may include, one or more transistor bias voltage nodes (not depicted) and one or more ground nodes 360, 362. As will be described later in conjunction with FIG. 4, each of the nodes 328, 338, 348, 352, 353, 354, 355 may correspond to conductive pads (e.g., pads 428, 438, 448, 452, 453, FIG. 4) to which other circuitry may be coupled (e.g., through wirebonds 270, FIG. 2).

RF switch 300 includes a transmit path between the transmit signal input node 328 and the antenna node 348. In addition, RF switch 300 includes a receive path between the antenna node 348 and the receive signal output node 338.

Along the transmit path of the RF switch 300, a plurality of transistors 320, 324 are electrically connected between the transmit signal input node 328 and the antenna node 348, according to an embodiment. More specifically, the plurality of transistors includes multiple shunt transistors 320 and multiple series transistors 324, which are referred to herein as "transmit shunt transistors" 320 and "transmit series transistors" 324 to differentiate them from their receive-path counterparts, which are described later. Each of transistors 320, 324 includes a control terminal 321, 325 (e.g., a gate terminal), a first current conducting terminal 322, 326 (e.g., a source terminal), and a second current conducting terminal 323, 327 (e.g., a drain terminal).

Each of the control terminals 321 of the transmit shunt transistors 320 is coupled to a first switch control signal node 352 (e.g., through a isolation resistor, not shown), and the level of a switch control signal provided through the first switch control signal node 352 determines whether the transmit shunt transistors 320 are in a conducting state or a non-conducting state. In the conducting state, current may readily flow through a channel between the first and second current conducting terminals 322, 323 of each of the transmit shunt transistors 320 (e.g., using a switch analogy, each transistor 320 is closed). Conversely, in the non-conducting state, current does not readily flow through the channel between the first and second current conducting terminals 322, 323 (e.g., using the switch analogy, each transistor 320 is open). Each of the first current conducting terminals 322 of the transmit shunt transistors 320 is coupled to the transmit signal input node 328, and each of the second current conducting terminals 323 of the transmit shunt transistors 320 is coupled to a ground node 360. Accordingly, the channels of the transmit shunt transistors 320 are connected in parallel between the transmit signal input node 328 and the ground node 360.

Each of the control terminals 325 of the transmit series transistors 324 is coupled to a second switch control signal node 353 (e.g., through a isolation resistor, not shown), and the level of a switch control signal provided through the second switch control signal node 353 determines whether the transmit series transistors 324 are in a conducting state or a non-conducting state. In the conducting state, current may readily flow through a channel between the first and second current conducting terminals 326, 327 of each of the transmit series transistors 324. Conversely, in the non-conducting state, current does not readily flow through the channel between the first and second current conducting terminals 326, 327. Each of the first current conducting terminals 326 of the transmit series transistors 324 is coupled to the transmit signal input node 328, and each of the second current conducting terminals 327 of the transmit series transistors 324 is coupled to the antenna node 348. Accordingly, the channels of the transmit series transistors 324 are connected in parallel between the transmit signal input node 328 and the antenna node 348. In addition, the first current conducting terminals 322, 326 of the transmit shunt transistors 320 and the transmit series transistors 324 are coupled together (and to the transmit signal input node 328).

Along the receive path of the RF switch 300, a plurality of transistors 330, 334 are electrically connected between the antenna node 348 and the receive signal output node 338, according to an embodiment. More specifically, the plurality of transistors includes multiple shunt transistors 330 and multiple series transistors 334, which are referred to herein as "receive shunt transistors" 330 and "receive series transistors" 334 to differentiate them from their transmit-path counterparts, which were described above. Each of transistors 330, 334 includes a control terminal 331, 335 (e.g., a gate terminal), a first current conducting terminal 332, 336 (e.g., a source terminal), and a second current conducting terminal 333, 337 (e.g., a drain terminal).

Each of the control terminals 331 of the receive shunt transistors 330 is coupled to a third switch control signal node 354 (e.g., through a isolation resistor, not shown), and the level of a switch control signal provided through the third switch control signal node 354 determines whether the receive shunt transistors 330 are in a conducting state or a non-conducting state. In the conducting state, current may readily flow through a channel between the first and second current conducting terminals 332, 333 of each of the receive shunt transistors 330. Conversely, in the non-conducting state, current does not readily flow through the channel between the first and second current conducting terminals 332, 333. Each of the first current conducting terminals 332 of the receive shunt transistors 330 is coupled to the receive signal output node 338, and each of the second current conducting terminals 333 of the receive shunt transistors 330 is coupled to a ground node 362. Accordingly, the channels of the receive shunt transistors 330 are connected in parallel between the receive signal output node 338 and the ground node 362. Although ground nodes 360, 362 are indicated with different reference numbers, they may correspond to the same (common) node.

Each of the control terminals 335 of the receive series transistors 334 is coupled to a fourth switch control signal node 355 (e.g., through a isolation resistor, not shown), and the level of a switch control signal provided through the fourth switch control signal node 355 determines whether the receive series transistors 334 are in a conducting state or a non-conducting state. In the conducting state, current may readily flow through a channel between the first and second current conducting terminals 336, 337 of each of the receive series transistors 334. Conversely, in the non-conducting state, current does not readily flow through the channel between the first and second current conducting terminals 336, 337. Each of the first current conducting terminals 336 of the receive series transistors 334 is coupled to the antenna node 348, and each of the second current conducting terminals 337 of the receive series transistors 334 is coupled to the receive signal output node 338. Accordingly, the channels of the receive series transistors 334 are connected in parallel between the antenna node 348 and the receive signal output node 338. In addition, the first current conducting terminals 332 of the receive shunt transistors 330 and the second current conducting terminals 337 of the receive series transistors 334 are coupled together (and to the receive signal output node 338).

During operation of the RF switch 300, switch control signals are provided through the switch control signal nodes 352-355 so that only one of the transmit path or the receive path are conducting RF signals through the RF switch 300 at any given time. More specifically, in a transmit mode of operation, switch control signals are provided through switch control signal nodes 352, 353 so that the transmit series transistors 324 are in a conducting state, and the transmit shunt transistors 320 are in a non-conducting state. In this configuration, RF signals are communicated from the transmit signal input node 328 through the transmit series transistors 324 to the antenna node 348. Also during the transmit mode, switch control signals are provided through switch control signal nodes 354, 355 to ensure that RF signals are not communicated through the receive path. More specifically, in the transmit mode, switch control signals are provided through switch control signal nodes 354, 355 so that the receive series transistors 334 are in a non-conducting state, and the receive shunt transistors 330 are in a conducting state. In this configuration, signal energy present on the receive signal output node 338 is shunted to the ground node 362.

Conversely, in a receive mode of operation, switch control signals are provided through switch control signal nodes 354, 355 so that the receive series transistors 334 are in a conducting state, and the receive shunt transistors 330 are in a non-conducting state. In this configuration, RF signals are communicated from the antenna node 348 through the receive series transistors 334 to the receive signal output node 338. Also during the receive mode, switch control signals are provided through switch control signal nodes 352, 353 to ensure that RF signals are not communicated through the transmit path. More specifically, in the receive mode, switch control signals are provided through switch control signal nodes 352, 353 so that the transmit series transistors 324 are in a non-conducting state, and the transmit shunt transistors 320 are in a conducting state. In this configuration, signal energy present on the transmit signal input node 328 is shunted to the ground node 360.

As the above description indicates, during the receive mode of operation, the receive series transistors 334 and the transmit shunt transistors 320 simultaneously are in conducting states, and the receive shunt transistors 330 and transmit series transistors 324 simultaneously are in non-conducting states. Similarly, during the transmit mode of operation, the transmit series transistors 324 and the receive shunt transistors 330 simultaneously are in conducting states, and the transmit shunt transistors 320 and receive series transistors 334 simultaneously are in non-conducting states.

In embodiments in which the receive series transistors 334 and the transmit shunt transistors 320 are of the same conductivity type (e.g., n-channel or p-channel for LDMOS transistors, or always-ON or always-OFF for HEMTs), switch control signal nodes 352, 355 may be coupled together to receive the same switch control signal. Alternatively, if the receive series transistors 334 and the transmit shunt transistors 320 are of different conductivity types, switch control signal nodes 352, 355 should be distinct, as the switch control signals received on nodes 352, 355 should be complementary with each other (e.g., when the switch control signal received on node 352 is high, the switch control signal received on node 355 is low, and vice versa). Similarly, in embodiments in which the transmit series transistors 324 and the receive shunt transistors 330 are of the same conductivity type, switch control signal nodes 353, 354 also may be coupled together to receive the same switch control signal. Alternatively, if the transmit series transistors 324 and the receive shunt transistors 330 are of different conductivity types, switch control signal nodes 353, 354 should be distinct, as the switch control signals received on nodes 353, 354 should be complementary with each other.

In the circuit diagram of FIG. 3, two transmit shunt transistors 320, three transmit series transistors 324, three receive shunt transistors 330, and three receive series transistors 334 are depicted. Each transistor 330, 324, 330, 334 represents a "transistor element" of a physical implementation of an embodiment of an RF switch IC (e.g., RF switch IC 400, FIG. 4). For example, as will be described in more detail below, a "transistor element" may be a single finger of a microwave field effect transistor. Thus, the circuit diagram of FIG. 3 depicts a three-finger transmit series transistor, a two-finger transmit shunt transistor, a three-finger receive series transistor, and a three-finger receive shunt transistor. The number of shunt and series transistor elements depicted in FIG. 3 is only an example of the numbers of parallel-connected shunt and series transistor elements that may be included in a physical implementation of an embodiment of an RF switch. Those of skill in the art would understand, based on the description herein, that each parallel-connected set of shunt and series transistor elements may include more or fewer transistor elements than is depicted in FIG. 3. In an actual physical implementation, an embodiment of an RF switch may include many more fingers (or transistor elements) in each set of parallel-connected series and shunt transistors than is depicted in FIG. 3.

Figure 4:
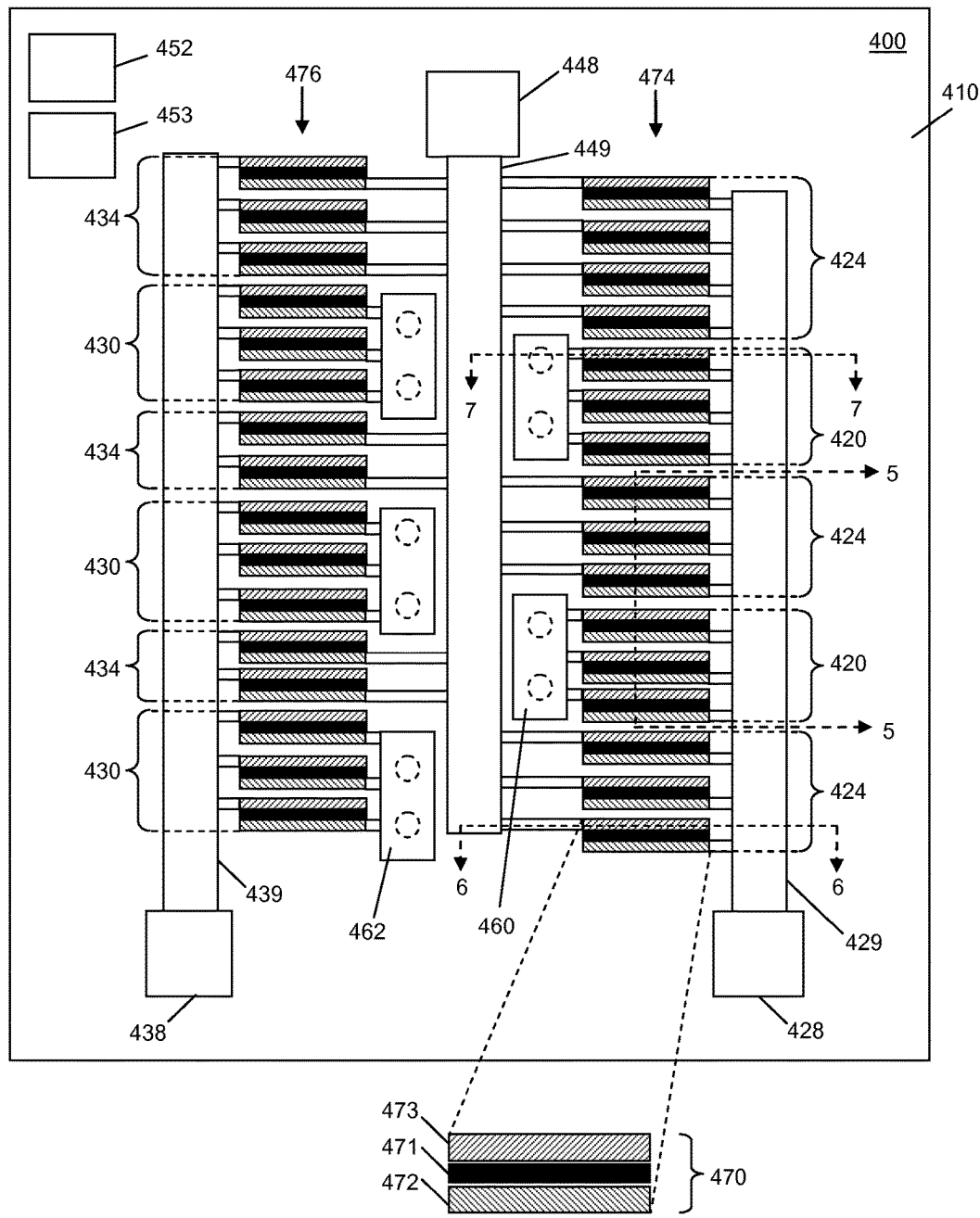
FIG. 4 is a top view of a monolithic RF switch integrated circuit (IC), in accordance with an embodiment.

In FIG. 3, the depiction of each series and shunt transistor path as multiple parallel-connected transistors is intended to facilitate understanding of embodiments of the physical implementations of RF switch ICs (e.g., RF switch IC 400, FIG. 4). As will be explained in more detail in conjunction with FIG. 4, in the transmit path, transistor elements associated with transmit shunt transistors (e.g., transmit shunt transistors 320) are physically "interleaved with" transistor elements associated with transmit series transistors (e.g., transmit series transistors 324). Similarly, in the receive path, transistor elements associated with receive shunt transistors (e.g., receive shunt transistors 330) are physically "interleaved with" transistor elements associated with receive series transistors (e.g., receive series transistors 334). As used herein, the term "interleaved with," as it relates to different types of objects (e.g., shunt transistor elements and series transistor elements), means that at least one instance of a first type of object (e.g., a series transistor element or a shunt transistor element) is physically located between two instances of a second type of object (e.g., two shunt transistor elements or two series transistor elements). In some cases, the first and second types of objects may be directly adjacent to each other without any other types of intervening objects. In other cases, some other type of object (e.g., a third type of electrical element) may be physically located between the interleaved first and second types of objects.

The series transistors (e.g., transmit series transistors 324 and receive series transistors 334) represent relatively high-power dissipating transistor elements, when compared with the relatively low-power dissipating shunt transistor elements (e.g., transmit shunt transistors 320 and receive shunt transistors 330). Accordingly, the junction temperatures of the series transistor elements may be significantly higher than the junction temperatures of the shunt transistor elements. By interleaving series transistor elements with shunt transistor elements, according to embodiments discussed in detail below, power dissipation within an RF switch IC is distributed in a manner that may significantly reduce the peak junction temperatures within the IC (e.g., the interleaving may reduce the junction temperatures at the IC's "hot spots"), thus more effectively spreading the heat produced by the transistor elements.

As used herein, the term "interleaved" means physically arranged in an alternating manner. For example, given six transistor elements "A" (e.g., shunt transistor elements) and six transistor elements "B" (e.g., series transistor elements), interleaved transistor elements having a 1:1 interleaving pattern would be physically arranged as follows: A-B-A-B-A-B-A-B-A-B-A-B. As another example, given nine transistor elements "A" and three transistor elements "B," interleaved transistor elements having a 3:1 interleaving pattern (i.e., a "N:1" interleaving pattern, where N is an integer greater than 1) may be physically arranged as follows: A-A-A-B-A-A-A-B-A-A-A-B. As yet another example, given six transistor elements "A" and six transistor elements "B," interleaved transistor elements having a 2:2 interleaving pattern (i.e., a "N:M" interleaving pattern, where N and M are both integers greater than 1) may be physically arranged as follows: A-A-B-B-A-A-B-B-A-A-B-B. In the "N:1" and "N:M" interleaving patterns, the N or M number of elements may be any reasonable integer greater than 1. Further, the number of elements in any set of adjacent elements of the same type may vary across a device. For example, another example of an interleaving pattern may be physically arranged as follows: A-A-B-B-B-A-B-B-B-A-A (i.e., a 2:3:1:3:2 interleaving pattern).

FIG. 4 is a top view of a layout of a monolithic RF switch IC 400 (e.g., a physical implementation of RF switch 110, 210, 300, FIGS. 1-3) that includes interleaved transistor elements 470 in transmit and receive paths, in accordance with an embodiment. As will be explained in more detail below, the interleaved transistor elements 470 are electrically connected to various conductive pads 428, 438, 448, 452, 453. The conductive pads 428, 438, 448, 452, 453 may be exposed at a top surface of the RF switch IC 400, and thus may serve as bond pads for wirebonds (e.g., wirebonds 270, FIG. 2), which provide for electrical connectivity to external circuitry (e.g., antenna 140, transmitter 120, receiver 130, FIG. 1, terminals 228, 248, 261, receive matching circuit IC 234, RF switch controller IC 250, FIG. 2, and so on). For enhanced understanding, FIG. 4 should be viewed simultaneously with FIGS. 5-7, which are side, cross-sectional views of the RF switch IC 400 along lines 5-5, 6-6, and 7-7, respectively.

Figure 8:
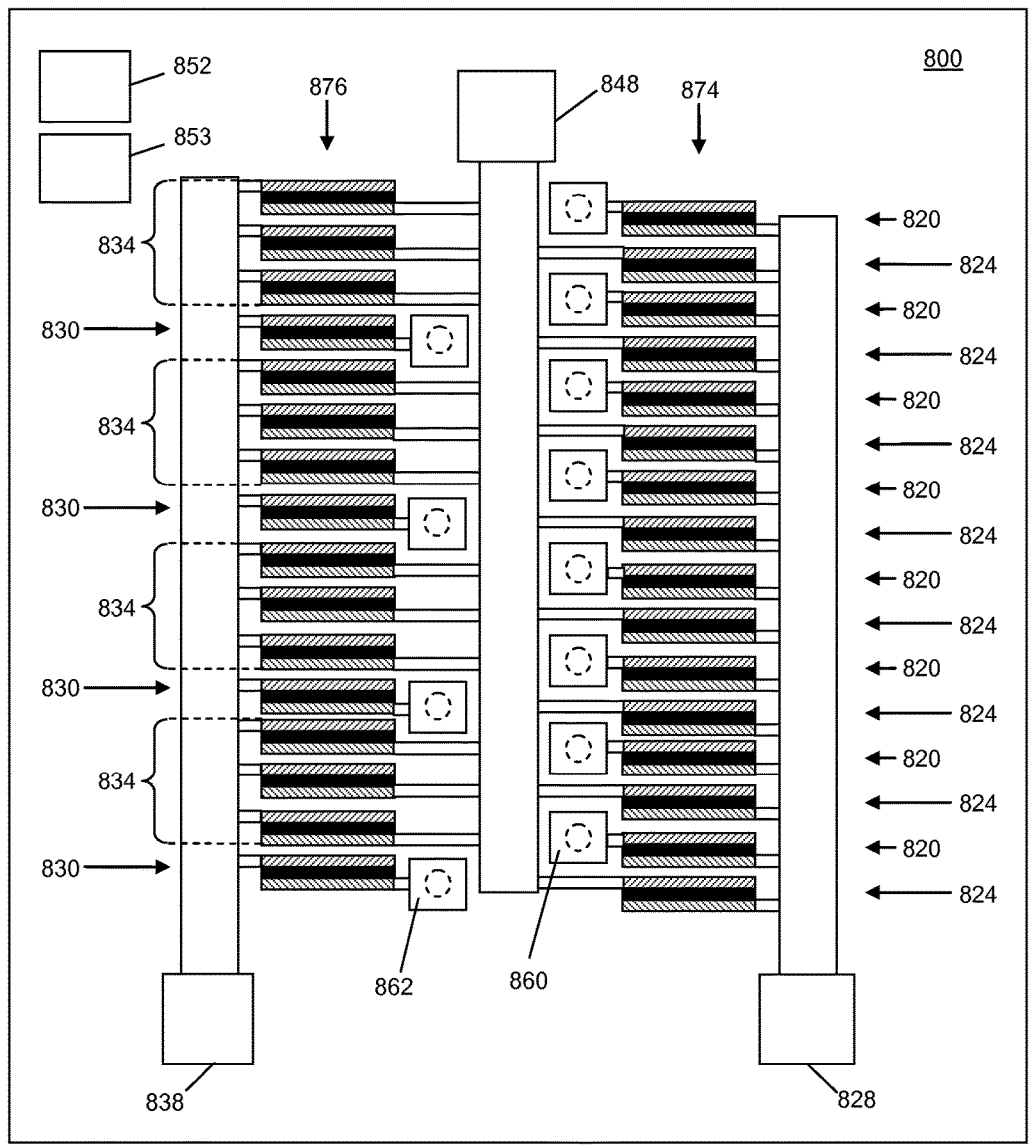
FIG. 8 is a top view of an RF switch IC, in accordance with another embodiment.

As will be explained in more detail below, a N:M interleaving pattern is implemented for the transistor elements 470 of both the transmit and receive paths in the embodiment of FIG. 4. More specifically, in the transmit path, sets 424 of multiple series transistor elements are interleaved with sets 420 of multiple shunt transistor elements. Similarly, in receive path, sets 434 of multiple series transistor elements are interleaved with sets 430 of multiple shunt transistor elements. As indicated above, in alternate embodiments, a 1:1 interleaving pattern or a N:1 interleaving pattern may be implemented (e.g., as shown in FIG. 8, described later).

The RF switch IC 400 is "monolithic," in that the sets 420, 424, 430, 434 of multiple shunt and series transistor elements of the transmit and receive paths are formed in and on a single integrated circuit substrate 410. According to an embodiment, the RF switch IC 400 may be formed on a gallium nitride (GaN)-based substrate 410, and such an embodiment is described in more detail below. Although a GaN-based device is described herein, those of skill in the art would understand, based on the description herein, that the inventive subject matter also may be implemented in RF devices that are formed on other types of substrates, as well, including silicon-based and gallium arsenide-based substrates. Further, although a particular heterojunction field effect transistor (HFET) configuration is illustrated in the Figures and described in detail below, those of skill in the art would understand, based on the description herein, that the inventive subject matter may be implemented in a variety of differently configured transistors, including differently-configured HFETs, pseudomorphic high electron mobility transistors (pHEMTs), metal-semiconductor field effect transistors (MESFETs), and laterally diffused metal-oxide semiconductor (LDMOS) transistors, to name a few.

According to an embodiment, each transistor element 470 is structured as an elongated transistor finger. On one side of the RF switch IC 400 (i.e., the right side, in FIG. 4), a first plurality of transistor fingers 470 comprising portions of the transmit path transistors (e.g., transistors 320, 324, FIG. 3) are arranged adjacent to each other in a first row 474. Similarly, on the other side of the RF switch IC 400 (i.e., the left side, in FIG. 4), a second plurality of transistor fingers 470 comprising portions of the receive path transistors (e.g., transistors 330, 334, FIG. 3) are arranged adjacent to each other in a second row 476. In each row 474, 476, the transistor fingers 470 are arranged with their long sides adjacent to each other.

Each transistor element 470 or finger includes an elongated control terminal 471 (e.g., gate terminal), with elongated first and second current carrying terminals 472, 473 (e.g., source and drain terminals) arranged on either side of the control terminal 471. As will be explained in more detail in conjunction with FIG. 5, the control terminal 471 is positioned over a variably conductive channel within the substrate 410, and the first and second current carrying terminals 472, 473 are positioned over opposite sides of the channel. During operation, voltages present on the control terminal 471 determine the magnitude of current flowing through the channel between the first and second current carrying terminals 472, 473. According to an embodiment, the control terminal pitch (i.e., the distance between control terminals 471 of transistor elements 470 that are directly adjacent to each other) is in a range of about 10 microns to about 50 microns (e.g., about 20 microns), although the control terminal pitch may be smaller or larger, as well. Further, according to an embodiment, each of the control terminals 471 has a width (vertical dimension in FIG. 4) in a range of about 0.15 microns to about 1.0 microns, and a length (horizontal dimension in FIG. 4) in a range of about 25 microns to about 500 microns, although the control terminal widths and lengths may be smaller or larger, as well.

Figure 5:
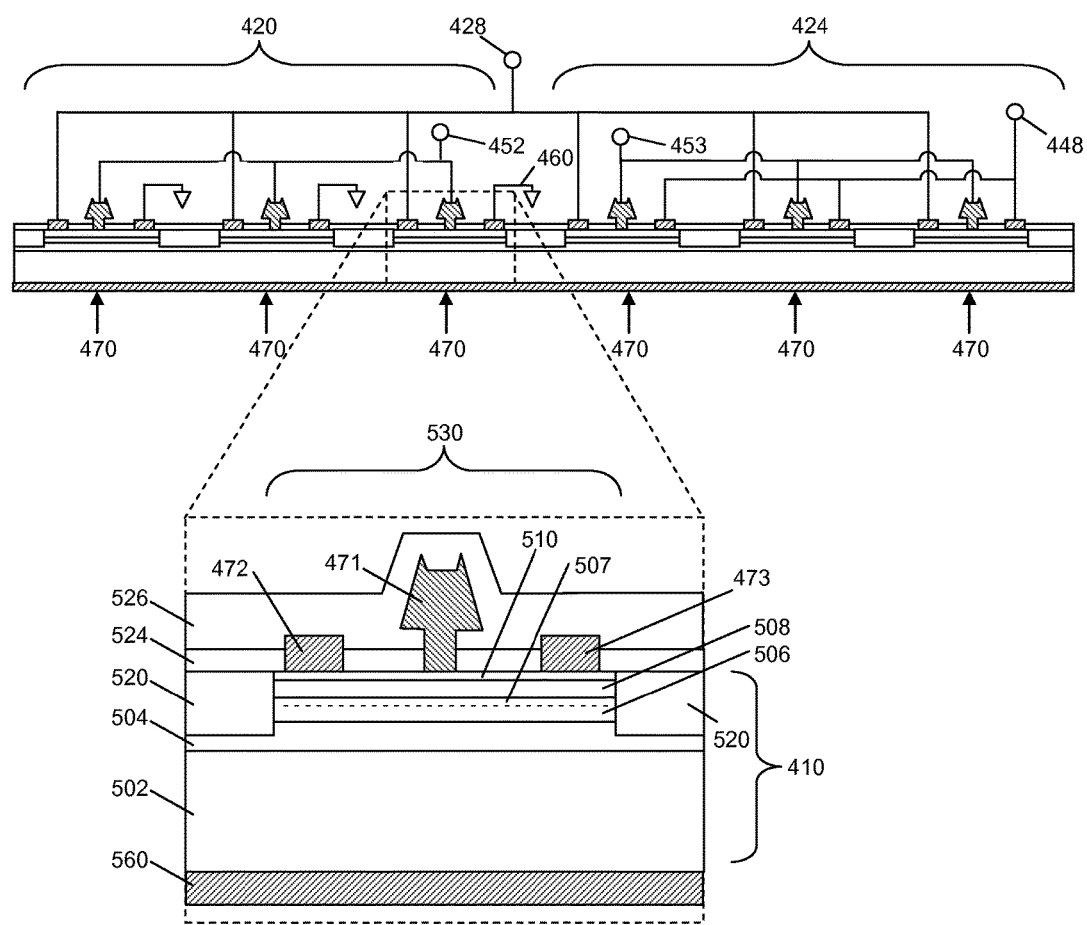
FIG. 5 is a cross-sectional, side view of the RF switch IC of FIG. 4 along line 5-5, in accordance with an embodiment.

FIG. 5 is a cross-sectional view of the RF switch IC 400 through line 5-5 (i.e., through six adjacent transistor elements 470 of the transmit path row 474), along with an enlarged cross-sectional view of one transistor element 470. According to an embodiment, the substrate 410 includes a host substrate 502, a buffer layer 504, a channel layer 506, a barrier layer 508, and a cap layer 510. The host substrate 502 may include silicon carbide (SiC), for example. In other embodiments, the host substrate 502 may include other materials such as sapphire, silicon (Si), GaN, aluminum nitride (AlN), diamond, poly-SiC, silicon on insulator, gallium arsenide (GaAs), indium phosphide (InP), and other substantially insulating or high resistivity materials.

The buffer layer 504 is formed on upper surface of the host substrate 502. The buffer layer 504, may include a number of group III-N semiconductor layers. Each of the semiconductor layers of the buffer layer 504 may include, for example, an epitaxially grown group III-nitride eptiaxial layer (e.g., layers of nitrogen (N)-face or gallium (Ga)-face materials). More specifically, for example, the buffer layer 504 may include at least one AlGaN mixed crystal layer having a composition denoted by $Al_xGa_{1-x}N$ with an aluminum mole fraction, X, which is in a range between 0 and 5. In alternate embodiments, the semiconductor layers of the buffer layer 504 may not be epitaxially grown, and/or may include Si, GaAs, InP, or other suitable materials.

A channel layer 506 is formed over the buffer layer 504. The channel layer 506 may include one or more group III-N semiconductor layers, for example. According to an embodiment, the channel layer 506 may include an $Al_XGa_{1-X}N$ layer, where X may be in a range between 0 and 5. In an embodiment, the channel layer 506 is configured as GaN (X=0) although other values of X may be used.

A barrier layer 508 is formed over the channel layer 506. The barrier layer 508 may include one or more group III-N semiconductor layers, for example. According to an embodiment, the barrier layer 508 may include at least one $Al_X Ga_{1-X}N$ layer, where X is in a range between 0 and 5. In some embodiments, the barrier layer 508 has a larger bandgap and larger spontaneous polarization than the channel layer 506 and, when the barrier layer 508 is in direct contact with the channel layer 506, a channel 507 is created in the form of a two dimensional electron gas (2-DEG) within the channel layer 506 near the interface between the channel layer 506 and barrier layer 508. In addition, strain between the barrier layer 508 and channel layer 506 may cause additional piezoelectric charge to be introduced into the 2-DEG and channel. There may be an additional AlN interbarrier layer (not shown) formed between the channel layer 506 and the barrier layer 508, in some embodiments, which may increase the channel charge and improve the electron confinement of the resultant 2-DEG. In other embodiments, the barrier layer 508 may include indium aluminum nitride (InAlN) layers, denoted $In_YAl_{1-Y}N$, where Y, the indium mole fraction, may be in a range between about 0.1 and about 0.2, although other values of Y may be used.

A cap layer 510 is formed over the barrier layer 508. The cap layer 510 presents a stable surface for the semiconductor substrate 410 and serves to protect the surface of the semiconductor substrate 410 from chemical and environmental exposure incidental to wafer processing. The cap layer 510 may include one or more group III-N semiconductor layers, for example. In an embodiment, the cap layer 510 is GaN.

One or more isolation regions 520 may be formed in the semiconductor substrate 410 to define active regions 530 along upper surface of the semiconductor substrate 410, according to an embodiment. The isolation regions 520 may be formed via an implantation procedure configured to damage the epitaxial and/or other semiconductor layers to create high resistivity regions of the semiconductor substrate 410 while leaving the crystal structure intact in the active regions 530. Alternatively, the isolation regions 520 may be formed by removing one or more of the epitaxial and/or other semiconductor layers of the semiconductor substrate 410, rendering the remaining layers of the semiconductor substrate 410 semi-insulating and leaving behind active region 530 "mesas" surrounded by high resistivity or semi-insulating isolation regions 520.

A first dielectric layer 524 is formed over the active regions 530 and isolation regions 520, in an embodiment. In an embodiment, control terminals 471 (or gate terminals) are formed over the semiconductor substrate 410 in the active regions 530. Each control terminal 471 is electrically coupled to a channel 507 through the cap layer 510 and the barrier layer 508. Changes to the electric potential on the control terminal 471 shifts the quasi Fermi level for the barrier layer 508 compared to the quasi Fermi level for the channel layer 506, and thereby modulates the electron concentration in the channel 507 within the semiconductor substrate 410 under the control terminal 471. The control terminal 471 may have a T-shaped cross-section with a vertical stem, as shown, or may have a square or rectangular shaped cross-section in other embodiments. In still other embodiments, the control terminal 471 may be recessed through the cap layer 510 and may extend partially into the barrier layer 508.

First and second current carrying terminals 472, 473 (or source and drain terminals) also are formed over and in contact with the semiconductor substrate 410 within each active region 530 on either side of the control terminal 471. In an embodiment, the first and second current carrying terminals 472, 473 are formed over and in contact with the cap layer 510. In other embodiments, the first and second current carrying terminals 472, 473 may be recessed through the cap layer 510 and extend partially through the barrier layer 508.

One or more additional dielectric layers 526 may be formed over the first dielectric layer 524 and over terminals 471-473. In addition, one or more metal layers (not shown in FIG. 5) may be formed in and over the additional dielectric layer(s) 526 to provide for electrical connectivity of the control terminals 471 and the first and second current carrying terminals 472, 473 to each other and to conductive pads 428, 438, 448, 452, 453. Also, according to an embodiment, a conductive layer 560 is formed on the bottom surface of the semiconductor substrate 410. As will be explained later in conjunction with FIG. 7, the conductive layer 560 may be electrically connected to conductive through substrate vias (TSVs) (e.g., TSVs 760, FIG. 7), which provide for electrical conductivity between the sets 420, 430 of shunt transistor elements 470 and the bottom surface of substrate 410. In addition, the conductive layer 560 may function to electrically and physically connect the semiconductor substrate 410 to another substrate (e.g., module substrate 202, FIG. 2).

As indicated both in FIG. 4 and FIG. 5, in the row 474 of transmit path transistor elements 470, the first current carrying terminals 472 of the transistor elements 470 of both the multiple series transistor element sets 424 and the multiple shunt transistor element sets 420 are electrically coupled to a transmit signal input pad 428 (e.g., corresponding to transmitter node 128, FIG. 1 or transmit signal input node 328, FIG. 3). For example, the first current carrying terminals 472 may be coupled to the transmit signal input pad 428 through a conductive bus 429 formed in a metal layer over the top surface of substrate 410. As shown in FIG. 4, the conductive bus 429 extends in parallel with the row 474 of transmit path transistor elements 470. Various other conductive structures (e.g., vias and traces) electrically connect the first current carrying terminals 472 to the conductive bus 429.

Figure 6:
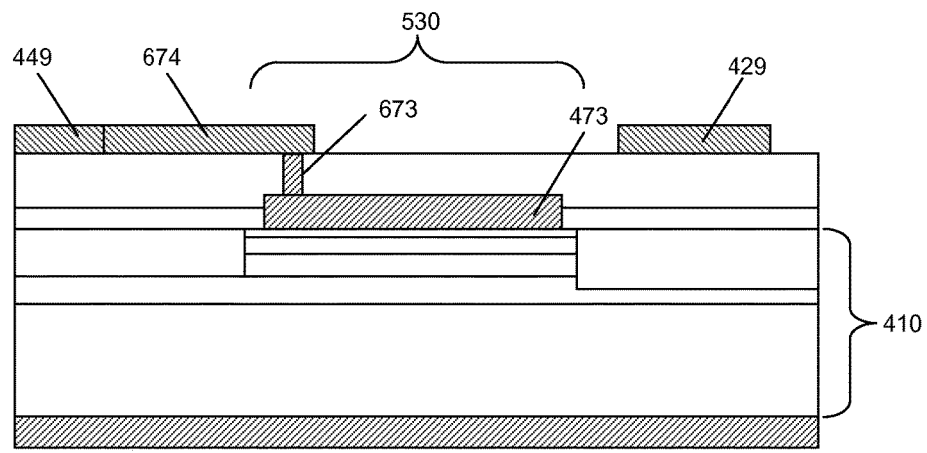
FIG. 6 is a cross-sectional, side view of the RF switch IC of FIG. 4 along line 6-6, in accordance with an embodiment.

Referring also to FIG. 6, which is a cross-sectional view through a second current carrying terminal 473 of one of the transistor elements 470 of the transmit path series transistor element sets 424, each of the second current carrying terminals 473 of the transistor elements 470 of the series transistor element sets 424 is electrically coupled to an antenna pad 448 (e.g., corresponding to antenna terminal 148, FIG. 1 or antenna node 348, FIG. 3). For example, the second current carrying terminals 473 may be electrically coupled to the antenna pad 448 through one or more conductive vias 673, one or more conductive traces 674, and a conductive bus 449 formed in a metal layer over the top surface of substrate 410. Once again, as shown in FIG. 4, the conductive bus 449 extends in parallel with the row 474 of transmit path transistor elements 470 (and also in parallel with the row 476 of receive path transistor elements 470).

The transistor elements 470 of the transmit path series transistor element sets 424 are considered to be "parallel-connected" because the first current carrying terminals 472 of each of the transistor elements 470 of the transmit path series transistor element sets 424 are electrically coupled to the same node (i.e., pad 428), and the second current carrying terminals 473 of each of the transistor elements 470 of the transmit path series transistor element sets 424 are electrically coupled to the same node (i.e., pad 448). In other words, the channels of each of the transistor elements 470 of the transmit path series transistor element sets 424 are electrically coupled in parallel between two nodes (i.e., pads 428 and 448).

Figure 7:
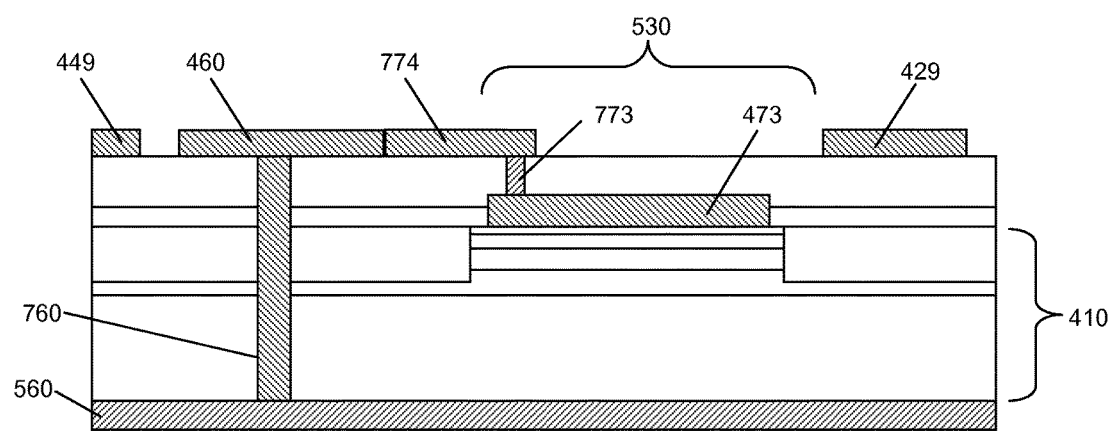
FIG. 7 is a cross-sectional, side view of the RF switch IC of FIG. 4 along line 7-7, in accordance with an embodiment.

Referring also to FIG. 7, which is a cross-sectional view through a second current carrying terminal 473 of one of the transistor elements 470 of the transmit path shunt transistor element sets 420, each of the second current carrying terminals 473 of the transistor elements 470 of the shunt transistor element sets 420 is electrically coupled to a ground reference pad 460 (e.g., corresponding to ground terminal 260, FIG. 2 or ground node 360, FIG. 3). For example, the second current carrying terminals 473 may be electrically coupled to the ground reference pad 460 through one or more conductive vias 773 and one or more conductive traces 774. When the RF switch IC 400 is coupled to a larger electrical system (e.g., module 200, FIG. 2), the ground reference pad 460 could be electrically coupled to a ground reference terminal (e.g., ground reference terminal 260, FIG. 2) using a wirebond (e.g., wirebond 270, FIG. 2). Alternatively, and as shown in FIG. 7, the ground reference pad 460 may be electrically coupled to the conductive layer 560 on the bottom surface of substrate 410 through one or more conductive TSVs 760, in an embodiment. As mentioned previously, the conductive layer 560 may function to electrically and physically connect the semiconductor substrate 410 to another substrate (e.g., module substrate 202, FIG. 2), and a ground reference voltage may be provided to the conductive layer 560 through the other substrate.

The transistor elements 470 of the transmit path shunt transistor element sets 420 are considered to be "parallel-connected" because the first current carrying terminals 472 of each of the transistor elements 470 of the transmit path shunt transistor element sets 420 are electrically coupled to the same node (i.e., pad 428), and the second current carrying terminals 473 of each of the transistor elements 470 of the transmit path shunt transistor element sets 420 are electrically coupled to the same node (i.e., pad 460 or layer 560). In other words, the channels of each of the transistor elements 470 of the transmit path shunt transistor element sets 420 are electrically coupled in parallel between two nodes (i.e., pads 428 and 460 or layer 560).

Referring now to the interconnections of the transistor elements 470 in the row 476 of receive path transistor elements 470, the second current carrying terminals 473 of the transistor elements 470 of both the multiple series transistor element sets 434 and the multiple shunt transistor element sets 430 are electrically coupled to a receive signal output pad 438 (e.g., corresponding to receiver node 138, FIG. 1 or receive signal output node 338, FIG. 3). For example, the second current carrying terminals 473 may be coupled to the receive signal output pad 438 through a conductive bus 439 formed in a metal layer over the top surface of substrate 410. As shown in FIG. 4, the conductive bus 439 extends in parallel with the row 476 of receive path transistor elements 470. Various other conductive structures (e.g., vias and traces) electrically connect the second current carrying terminals 473 to the conductive bus 439.

In a manner similar to that depicted in FIG. 6, each of the first current carrying terminals 472 of the transistor elements 470 of the receive path series transistor element sets 434 is electrically coupled to antenna pad 448 (e.g., corresponding to antenna terminal 148, FIG. 1 or antenna node 348, FIG. 3). For example, the first current carrying terminals 472 may be electrically coupled to the antenna pad 448 through one or more conductive vias (e.g., similar to vias 673, FIG. 6), one or more conductive traces (e.g., similar to traces 674, FIG. 6), and conductive bus 449.

In a manner similar to that depicted in FIG. 7, each of the first current carrying terminals 472 of the transistor elements 470 of the shunt transistor element sets 430 is electrically coupled to a ground reference pad 462 (e.g., corresponding to ground terminal 260, FIG. 2 or ground node 362, FIG. 3). For example, the first current carrying terminals 472 may be electrically coupled to the ground reference pad 462 through one or more conductive vias (e.g., similar to vias 773, FIG. 7) and one or more conductive traces (e.g., similar to traces 774, FIG. 7). Once again, when the RF switch IC 400 is coupled to a larger electrical system (e.g., module 200, FIG. 2), the ground reference pad 462 could be electrically coupled to a ground reference terminal (e.g., ground reference terminal 260, FIG. 2) using a wirebond (e.g., wirebond 270, FIG. 2). Alternatively, in a manner similar to that shown in FIG. 7, the ground reference pad 462 may be electrically coupled to the conductive layer 560 on the bottom surface of substrate 410 through one or more conductive TSVs (e.g., similar to TSV 760, FIG. 7), in an embodiment.

As indicated in FIG. 5, in the row 474 of transmit path transistor elements 470, the control terminals 471 of the sets 420 of transmit path shunt transistor elements 470 are coupled to a first switch control pad 452 (e.g., corresponding to switch control signal node 352, FIG. 3). Conversely, the control terminals 471 of the sets 424 of transmit path series transistor elements 470 are coupled to a second switch control pad 453 (e.g., corresponding to switch control signal node 353, FIG. 3). Similarly, in the row 476 of receive path transistor elements 470, the control terminals 471 of the sets 430 of receive path shunt transistor elements 470 are coupled to the second switch control pad 453 (e.g., corresponding to switch control signal node 354, FIG. 3). Finally, the control terminals 471 of the sets 434 of receive path series transistor elements 470 are coupled to the first switch control pad 452 (e.g., corresponding to switch control signal node 355, FIG. 3). Although the interconnections between the control terminals 471 of the transistor elements 470 are not depicted in FIG. 4 to avoid obscuring other aspects of the layout, the interconnections may be made, for example, using various conductive structures (e.g., vias and traces) over the top surface of the substrate 410.

As indicated previously, during operation of the RF switch IC 400, switch control signals are provided (e.g., by RF switch controller 250, FIG. 2) through the first and second switch control pads 452, 453 so that only one of the transmit path or the receive path are conducting RF signals through the RF switch IC 400 at any given time. More specifically, in a transmit mode of operation, switch control signals are provided through the first and second switch control pads 452, 453 so that the sets 424 of transmit path series transistor elements 470 are in a conducting state, and the sets 420 of transmit path shunt transistor elements 470 are in a non-conducting state. In this configuration, RF signals are communicated from the transmit signal input pad 428 through the sets 424 of transmit path series transistor elements 470 to the antenna pad 448. Also during the transmit mode, switch control signals are provided through the first and second switch control pads 452, 453 to ensure that RF signals are not communicated through the receive path. More specifically, in the transmit mode, switch control signals are provided through the first and second switch control pads 452, 453 so that the sets 434 of receive path series transistor elements 470 are in a non-conducting state, and the sets 430 of receive path shunt transistor elements 470 are in a conducting state. In this configuration, signal energy present on the receive signal output pad 438 is shunted to a ground reference pad 462.

Conversely, in a receive mode of operation, switch control signals are provided through the first and second switch control pads 452, 453 so that the sets 434 of receive path series transistor elements 470 are in a conducting state, and the sets 430 of receive path shunt transistor elements 470 are in a non-conducting state. In this configuration, RF signals are communicated from the antenna pad 448 through the sets 434 of receive path series transistor elements 470 to the receive signal output pad 438. Also during the receive mode, switch control signals are provided through the first and second switch control pads 452, 453 to ensure that RF signals are not communicated through the transmit path. More specifically, in the receive mode, switch control signals are provided through the first and second switch control pads 452, 453 so that the sets 424 of transmit path series transistor elements 470 are in a non-conducting state, and the sets 420 of transmit path shunt transistor elements 470 are in a conducting state. In this configuration, signal energy present on the transmit signal input pad 428 is shunted to the ground reference pad 460.

As the above description indicates, during the receive mode of operation, the sets 434 of receive path series transistor elements 470 and the sets 420 of transmit path shunt transistor elements 470 simultaneously are in conducting states, and the sets 430 of receive path shunt transistor elements 470 and the sets 424 of transmit path series transistor elements 470 simultaneously are in non-conducting states. Similarly, during the transmit mode of operation, the sets 424 of transmit path series transistor elements 470 and the sets 430 of receive path shunt transistor elements 470 simultaneously are in conducting states, and the sets 420 of transmit path shunt transistor elements 470 and sets 434 of receive path series transistor elements 470 simultaneously are in non-conducting states.

The RF switch IC 400 of FIG. 4 includes rows 474, 476 of transistor elements 470 that have N:M interleaving patterns. In other embodiments, a 1:1 interleaving pattern and/or N:1 interleaving patterns may be implemented. For example, FIG. 8 is a top view of a layout of a monolithic RF switch IC 800 (e.g., a physical implementation of RF switch 110, 210, 300, FIGS. 1-3) that includes interleaved transistor elements having a 1:1 interleaving pattern for the transmit path, and a N:1 interleaving pattern for the receive path, in accordance with an alternate embodiment.

More specifically, in the row 874 of transistor elements corresponding to the transmit path, sets of one series transistor element 824 are interleaved with sets of one shunt transistor element 820. As with the embodiment discussed in conjunction with FIG. 4, a first current carrying terminal of each shunt transistor element 820 is electrically coupled with a transmit signal input pad 828, and a second current carrying terminal of each shunt transistor element 820 is electrically coupled with a ground reference pad 860. Further, a first current carrying terminal of each series transistor element 824 is electrically coupled with a transmit signal input pad 828, and a second current carrying terminal of each series transistor element 824 is electrically coupled with an antenna pad 848.

Conversely, in the row 876 of transistor elements corresponding to the receive path, sets of three series transistor elements 834 are interleaved with sets of one shunt transistor element 830. As with the embodiment discussed in conjunction with FIG. 4, a first current carrying terminal of each shunt transistor element 830 is electrically coupled with a ground reference pad 862, and a second current carrying terminal of each shunt transistor element 820 is electrically coupled with a receive signal output pad 838. Further, a first current carrying terminal of each series transistor element 834 is electrically coupled with the antenna pad 848, and a second current carrying terminal of each series transistor element 834 is electrically coupled with the receive signal output pad 838.

In the row 874 of transmit path transistor elements, the control terminals of the shunt transistor elements 820 are coupled to a first switch control pad 852 (e.g., corresponding to switch control signal node 352, FIG. 3), and the control terminals of the series transistor elements 824 are coupled to a second switch control pad 853 (e.g., corresponding to switch control signal node 353, FIG. 3). Similarly, in the row 876 of receive path transistor elements, the control terminals of the shunt transistor elements 830 are coupled to the second switch control pad 853 (e.g., corresponding to switch control signal node 354, FIG. 3), and the control terminals of the series transistor elements 834 are coupled to the first switch control pad 852 (e.g., corresponding to switch control signal node 355, FIG. 3). The RF switch IC 800 may be operated in a manner that is substantially similar to the manner of operation of RF switch IC 400 (FIG. 4).

Although FIGS. 4 and 8 depict rows 474, 476, 874, 876 having particular numbers of interleaved transistor elements 470 (i.e., 16 transistor elements in each row), and having particular ratios of series transistor elements to shunt transistor elements (i.e., 10:6 in row 474, 7:9 in row 476, 8:8 in row 874, and 9:4 in row 876), other devices may have more or fewer interleaved transistor elements 470, different ratios of different types of transistor elements 470, and different numbers of rows. For example, embodiments of devices may have as few as a single row of transistor elements or more than two rows of transistor elements. Further, embodiments of devices may have any number of transistor elements in a range of 3 to 50 transistor elements or more in any given row.

Figure 9:
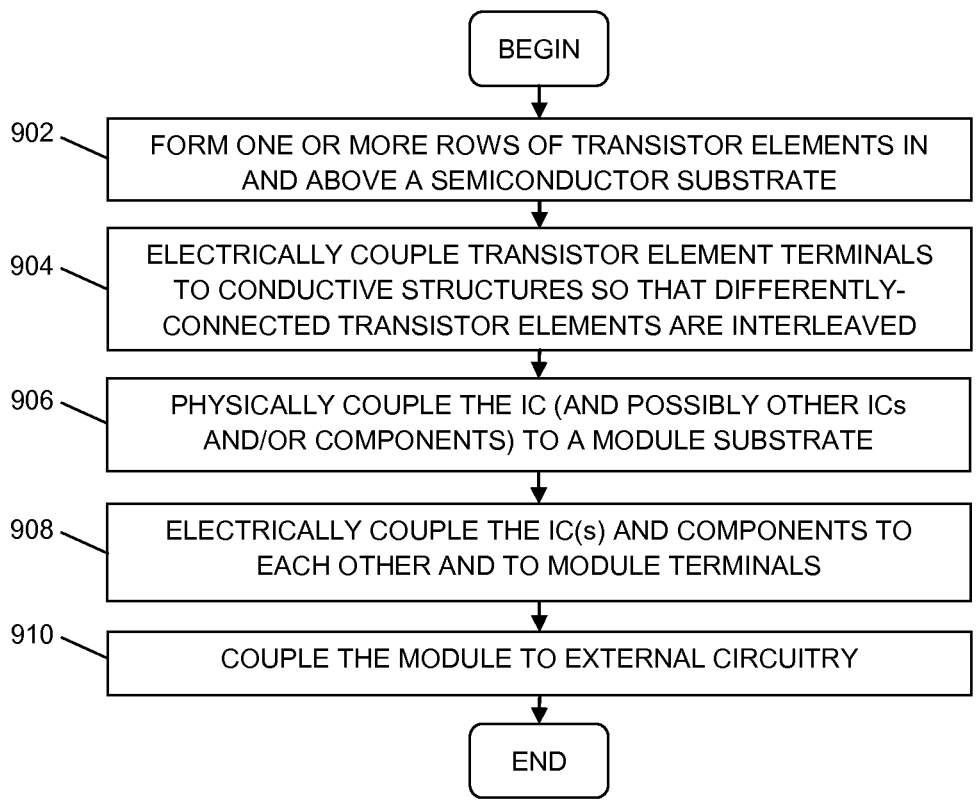
FIG. 9 is a flowchart of a method of fabricating an IC with interleaved transistor elements, and a module that includes the IC, in accordance with an embodiment.

FIG. 9 is a flowchart of a method of fabricating an IC (e.g., RF switch IC 400, 800, FIGS. 4, 8) with interleaved transistor elements, and a module (e.g., module 200, FIG. 2) that includes the IC, in accordance with an embodiment. In a typical IC fabrication process, a plurality of ICs is fabricated in parallel on a semiconductor wafer, and one of the final fabrication steps includes singulating the individual ICs from the wafer. For simplicity of description, fabrication of a single IC is described below. Those of skill in the art would understand, based on the description herein, that a plurality of ICs may be fabricated simultaneously, as just indicated. Although not specifically pointed out below, when wafer fabrication processes are employed, an IC singulation process may be performed, for example, after block 904. Similarly, a typical module fabrication process (or IC packaging process) may include simultaneously forming a plurality of modules on a leadframe or PCB, and subsequently singulating each module from the leadframe or PCB.

Although also not specifically pointed out below, a module singulation process may be performed, for example, after block 908.

To facilitate understanding, the below-described method will make reference to fabricating RF switch ICs 400, 800 (FIGS. 4, 8). However, those of skill in the art would understand, based on the description herein, that the fabrication embodiments alternatively may be used to fabricate differently configured RF switch ICs or other types of devices altogether. Accordingly, reference to the above-described RF switch IC embodiments should not be construed to limit the scope of the inventive subject matter only to those embodiments.

The method may begin, in block 902, by forming one or more rows of transistor elements (e.g., rows 474, 476, 874, 876, FIGS. 4, 8) in and above a semiconductor substrate (e.g., substrate 410, FIG. 4). As discussed above, the semiconductor substrate may include any of a variety of different semiconductor substrate materials (e.g., GaN, Si, GaAs, and so on), and the transistor elements may have any of a variety of different structures (e.g., HFET, HEMT, LDMOS FET, and so on). According to an embodiment, prior to forming the transistor elements, conductive TSVs (e.g., TSVs 770, FIG. 7) may be formed partially or entirely through the substrate.

In the above-described embodiments of RF switch ICs (e.g., RF switch ICs 400, 800), two rows of transistor elements are formed, where one row (e.g., row 474, 874) corresponds to transistor elements for a transmit path, and the other row (e.g., row 476, 876) corresponds to transistor elements for a receive path. In other embodiments, an IC may include only a single row of transistor elements, or more than two rows of transistor elements. In the description below, an embodiment with two rows of transistor elements is described.

Generally, each transistor element includes a control terminal and first and second current carrying terminals. In block 904, the method may continue by electrically coupling the terminals of the transistor elements to various conductive structures (e.g., to pads, vias, traces, and so on) so that differently-connected transistor elements are interleaved with each other. According to an embodiment, within a first row of transistor elements, the first current carrying terminals of a first subset of the transistor elements (e.g., shunt transistor elements) are electrically coupled to a first conductive structure (e.g., pad 428, 828), and the second current carrying terminals of the first subset of the transistor elements are electrically coupled to a second conductive structure (e.g., to pad 460, 860). Further, in the first row, the first current carrying terminals of a second subset of the transistor elements (e.g., series transistor elements) are electrically coupled to the first conductive structure (e.g., pad 428, 828), and the second current carrying terminals of the second subset of the transistor elements are electrically coupled to a third conductive structure (e.g., to pad 448, 848). Within the first row, the first subset of transistor elements is interleaved with the second set of transistor elements, according to an embodiment.

Within a second row of transistor elements, the first current carrying terminals of a first subset of the transistor elements (e.g., shunt transistor elements) are electrically coupled to a fourth conductive structure (e.g., pad 462, 862), and the second current carrying terminals of the first subset of the transistor elements are electrically coupled to a fifth conductive structure (e.g., to pad 438, 838). Further, in the second row, the first current carrying terminals of a second subset of the transistor elements (e.g., series transistor elements) are electrically coupled to the third conductive structure (e.g., pad 448, 848), and the second current carrying terminals of the second subset of the transistor elements are electrically coupled to the fifth conductive structure (e.g., to pad 438, 838). Once again, within the second row, the first subset of transistor elements is interleaved with the second set of transistor elements, according to an embodiment.

In addition to electrically coupling the current carrying terminals of the transistor elements to various conductive structures (e.g., pads 428, 438, 448, 460, 462, 828, 838, 848, 860, 862), the control terminals of the transistor elements also are electrically coupled to sixth and seventh conductive structures (e.g., pads 452, 453, 852, 853). More particularly, the control terminals of the first-row, first-subset transistor elements and the second-row, second-subset transistor elements are electrically coupled to a sixth conductive structure (e.g., pad 452, 852). In addition, the control terminals of the first-row, second-subset transistor elements and the second-row, first-subset transistor elements are electrically coupled to a seventh conductive structure (e.g., pad 453, 853).

Completion of the step of electrically coupling the transistor element terminals to the various conductive structures results, for example, in one or more rows of transistor elements in which "shunt" transistor elements are interleaved with "series" transistor elements. Although not specifically shown in FIG. 9, the backside of the semiconductor substrate may be thinned (e.g., to expose TSVs 770, FIG. 7), and a conductive layer (e.g., conductive layer 560, FIG. 5) may be formed on the bottom surface of the semiconductor substrate. In this way, the second and fourth conductive structures (e.g., pads 460, 462, 860, 862) are electrically coupled (e.g., through TSVs 770) to a ground reference node (e.g., to conductive layer 560, FIG. 5).

In block 906, the IC (e.g., RF switch IC 400, 800) is physically coupled to a module substrate (e.g., to module substrate 202, FIG. 2). In addition, one or more additional ICs and/or components (e.g., ICs 232, 234, 250, FIG. 2) also may be physically coupled to the module substrate.

In block 908, the IC(s) and components are electrically coupled to each other, and to terminals that are configured to convey signals, power, and ground references between external circuitry and the IC(s)/components of the module. As discussed previously, the module substrate configuration, the method of coupling the IC(s) and components to the module's terminals, and the number of ICs within the module defines the module or package type. The module may then be completed (e.g., by encapsulating the module or containing the module in an air cavity package). Once the module is completed, it may be physically and electrically coupled to external circuitry (e.g., other portions of system 100, FIG. 1), in block 910.

An embodiment of a monolithic integrated circuit (e.g., an RF switch) includes a semiconductor substrate, a first plurality of parallel-connected transistor elements (e.g., transistor fingers) proximate to a first surface of the substrate, and a second plurality of parallel-connected transistor elements proximate to the first surface. The first plurality of transistor elements is interleaved with the second plurality of transistor elements.

An embodiment of an RF switch includes a semiconductor substrate with a first surface and a second surface, a plurality of first series transistor elements proximate to the first surface, and a plurality of first shunt transistor elements proximate to the first surface. Each of the first series transistor elements has a channel that is electrically coupled between a first node and an antenna node. Each of the first shunt transistor elements has a channel that is electrically coupled between the first node and a ground node. The plurality of first series transistor elements is interleaved with the plurality of first shunt transistor elements in a first row.

According to a further embodiment, the RF switch also includes a plurality of second series transistor elements proximate to the first surface, and a plurality of second shunt transistor elements proximate to the first surface. Each of the second series transistor elements has a channel that is electrically coupled between the antenna node and a receive signal output node. Each of the second shunt transistor elements has a channel that is electrically coupled between the receive signal output node and the ground node.

According to a further embodiment, the RF switch also includes a controller configured to provide control signals to control terminals of the first series transistor elements, the first shunt transistor elements, the second series transistor elements, and the second shunt transistor elements. The control signals are provided so that, during a transmit mode of operation, the first series transistor elements and the second shunt transistor elements are in a conducting state, and the second series transistor elements and the first shunt transistor elements are in a non-conducting state. In addition, the control signals are provided so that, during a receive mode of operation, the second series transistor elements and the first shunt transistor elements are in a conducting state, and the first series transistor elements and the second shunt transistor elements are in a non-conducting state.

An embodiment of a method of fabricating an integrated circuit includes forming a first plurality of transistor elements proximate to a first surface of a semiconductor substrate, and forming a second plurality of transistor elements proximate to the first surface, where the first plurality of transistor elements are interleaved with the second plurality of transistor elements in a first row. The method also includes electrically coupling first current carrying terminals of the first plurality of transistor elements to a first node, electrically coupling first current carrying terminals of the second plurality of transistor elements to the first node, electrically coupling second current carrying terminals of the first plurality of transistor elements to a second node, and electrically coupling second current carrying terminals of the second plurality of transistor elements to a third node.

According to a further embodiment, the method also includes forming a third plurality of transistor elements proximate to the first surface of the semiconductor substrate, and forming a fourth plurality of transistor elements proximate to the first surface, wherein the third plurality of transistor elements and the fourth plurality of transistor elements are arranged in a second row. The further embodiment also includes electrically coupling first current carrying terminals of the third plurality of parallel-connected transistor elements to the second node, electrically coupling first current carrying terminals of the fourth plurality of parallel-connected transistor elements to the third node, electrically coupling second current carrying terminals of the third plurality of parallel-connected transistor elements to a fourth node, and electrically coupling second current carrying terminals of the fourth plurality of parallel-connected transistor elements to the fourth node.

The foregoing detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the foregoing technical field, background, or detailed description.

For the sake of brevity, conventional semiconductor fabrication techniques may not be described in detail herein. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of fabricating a monolithic integrated circuit, the method comprising:
    forming a first plurality of first transistor elements proximate to a first surface of a semiconductor substrate;
    forming a second plurality of second transistor elements proximate to the first surface, wherein the first transistor elements are interleaved with the second transistor elements in a first row;
    electrically coupling first current carrying terminals of the first transistor elements to a first node;
    electrically coupling first current carrying terminals of the second transistor elements to the first node;
    electrically coupling second current carrying terminals of the first transistor elements to an antenna node; and
    electrically coupling second current carrying terminals of the second transistor elements to a ground node.

2. The method of claim 1, wherein:
    electrically coupling the first current carrying terminals of the first transistor elements to the first node includes forming a first conductive pad proximate the first surface, and electrically coupling the first current carrying terminals of the first transistor elements to the first conductive pad;
    electrically coupling the first current carrying terminals of the second transistor elements to the first node includes electrically coupling the first current carrying terminals of the second transistor elements to the first conductive pad; and electrically coupling the second current carrying terminals of the first transistor elements to the antenna node includes forming a second conductive pad proximate the first surface, and electrically coupling the second current carrying terminals of the first transistor elements to the second conductive pad.

3. The method of claim 1, wherein electrically coupling the second current carrying terminals of the second transistor elements to the ground node comprises:
forming a through substrate via between the first surface of the semiconductor substrate and a second surface of the semiconductor substrate, and electrically coupling the second current carrying terminals of the second transistor elements to the through substrate via.

4. The method of claim 1, wherein each of the transistor elements is a transistor finger, which includes the first current carrying terminal, the second current carrying terminal, and a control terminal.

5. The method of claim 1, wherein the first and second transistor elements are interleaved with a 1:1 interleaving pattern.

6. The method of claim 1, wherein the first and second transistor elements are interleaved with a N:M:multiple interleaving pattern, where N and M are both integers greater than 1.

7. The method of claim 1, wherein the first and second transistor elements are interleaved with a N:1 interleaving pattern, where N is an integer greater than 1.

8. The method of claim 1, further comprising:
forming a third plurality of third transistor elements proximate to the first surface of the semiconductor substrate; and
forming a fourth plurality of fourth transistor elements proximate to the first surface, wherein the third transistor elements and the fourth transistor elements are arranged in a second row.

9. The method of claim 8, further comprising:
electrically coupling first current carrying terminals of the third transistor elements to the antenna node;
electrically coupling first current carrying terminals of the fourth transistor elements to the ground node;
electrically coupling second current carrying terminals of the third transistor elements to a fourth node; and
electrically coupling second current carrying terminals of the fourth transistor elements to the fourth node.

10. The method of claim 8, wherein the third transistor elements are interleaved with the fourth transistor elements.

11. The method of claim 1, wherein:
each of the first transistor elements is a relatively high-power dissipating series transistor element; and
each of the second transistor elements is a relatively low-power dissipating shunt transistor element.

12. A method of fabricating a radio frequency (RF) switch, the method comprising:
forming a plurality of first series transistor elements proximate to a first surface of a semiconductor substrate, wherein each of the first series transistor elements has a channel that is electrically coupled between a first node and an antenna node; and
forming a plurality of first shunt transistor elements proximate to the first surface of the semiconductor substrate, wherein each of the first shunt transistor elements has a channel that is electrically coupled between the first node and a ground node, and the plurality of first series transistor elements is interleaved with the plurality of first shunt transistor elements in a first row.

13. The method of claim 12, further comprising:
electrically coupling a controller to control terminals of the first series transistor elements and the first shunt transistor elements, wherein the controller is configured to provide control signals to the control terminals so that, at any given time, either the first series transistor elements or the first shunt transistor elements, but not both, are in a conducting state.

14. The method of claim 12, wherein the first node is a transmit signal input node, and fabricating the RF switch further comprises:
forming a plurality of second series transistor elements proximate to the first surface of the semiconductor substrate, wherein each of the second series transistor elements has a channel that is electrically coupled between the antenna node and a receive signal output node; and
forming a plurality of second shunt transistor elements proximate to the first surface of the semiconductor substrate, wherein each of the second shunt transistor elements has a channel that is electrically coupled between the receive signal output node and the ground node.

15. The method of claim 14, further comprising:
electrically coupling a controller to control terminals of the first series transistor elements, the first shunt transistor elements, the second series transistor elements, and the second shunt transistor elements, wherein the controller is configured to provide control signals to the control terminals so that,
during a transmit mode of operation, the first series transistor elements and the second shunt transistor elements are in a conducting state, and the second series transistor elements and the first shunt transistor elements are in a non-conducting state, and
during a receive mode of operation, the second series transistor elements and the first shunt transistor elements are in a conducting state, and the first series transistor elements and the second shunt transistor elements are in a non-conducting state.

16. The method of claim 14, wherein the plurality of second series transistor elements is interleaved with the plurality of second shunt transistor elements in a second row.

17. The method of claim 1, wherein:
the first node includes a first conductive bus formed in a metal layer over the first surface of the semiconductor substrate on a first side of the first row; and
the antenna node includes a second conductive bus formed over the first surface of the semiconductor substrate on a second side of the first row that is opposite the first side.

18. The method of claim 17, wherein:
electrically coupling the second current carrying terminals of the second transistor elements to the ground node includes forming a first plurality of through substrate vias between the first surface of the semiconductor substrate and a second surface of the semiconductor substrate, and electrically coupling the second current carrying terminals of the second transistor elements to the first plurality of through substrate vias.

19. The method of claim 9, wherein:
the first node includes a first conductive bus formed in a metal layer over the first surface of the semiconductor substrate on a first side of the first row;
the fourth node includes a second conductive bus formed in a metal layer over the first surface of the semiconductor substrate on a first side of the second row; and the antenna node includes a third conductive bus formed over the first surface of the semiconductor substrate on second sides of the first and second rows that are opposite the first sides.

20. The method of claim 19, wherein:

electrically coupling the second current carrying terminals of the second transistor elements to the ground node includes forming a first plurality of through substrate vias between the first surface of the semiconductor substrate and a second surface of the semiconductor substrate, and electrically coupling the second current carrying terminals of the second transistor elements to the first plurality of through substrate vias; and electrically coupling the first current carrying terminals of the fourth transistor elements to the ground node includes forming a second plurality of through substrate vias between the first surface of the semiconductor substrate and the second surface of the semiconductor substrate, and electrically coupling the first current carrying terminals of the fourth transistor elements to the second plurality of through substrate vias.

* * * * *